US012733264B2

(12) United States Patent
Park et al.

(10) Patent No.: US 12,733,264 B2
(45) Date of Patent: Sep. 8, 2026

(54) PLANAR T-COIL AND INTEGRATED CIRCUIT INCLUDING THE SAME

(71) Applicant: SAMSUNG ELECTRONICS CO., LTD., Suwon-si (KR)

(72) Inventors: Jinkwan Park, Hwaseong-si (KR); Janghoo Kim, Yongin-si (KR); Yoonsuk Park, Hwaseong-si (KR); Yoochang Sung, Hwaseong-si (KR); Changsik Yoo, Seoul (KR); Jeongdon Ihm, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1104 days.

(21) Appl. No.: 17/856,394

(22) Filed: Jul. 1, 2022

(65) Prior Publication Data

US 2023/0027964 A1 Jan. 26, 2023

(30) Foreign Application Priority Data

Jul. 19, 2021 (KR) ........................ 10-2021-0094458

(51) Int. Cl.
*H10D 89/60* (2025.01)
*H03H 7/01* (2006.01)
(Continued)

(52) U.S. Cl.
CPC ............. *H10D 89/911* (2025.01); *H10D 1/20* (2025.01); *H10W 44/20* (2026.01); *H03H 7/0115* (2013.01)

(58) Field of Classification Search
CPC ........ H10D 89/11; H10D 1/20; H03H 7/0115; H01L 23/66
(Continued)

(56) References Cited

U.S. PATENT DOCUMENTS 6,587,025 B2 * 7/2003 Smith ................ H01F 17/0013 336/200
7,248,035 B2 7/2007 Babcock et al.
(Continued)

FOREIGN PATENT DOCUMENTS

CN 111681851 A 9/2020
KR 10-2020-0063158 A 6/2020
KR 10-2020-0086992 A 7/2020

OTHER PUBLICATIONS

Ting Chen et al., "Accurate Modeling of Three-Port Center-tapped Octagonal Inductors for SPDT Switch Design in 0.13-μm BiCMOS" , IEEE, (2016), (5 pages total).
(Continued)

*Primary Examiner* — Shawki S Ismail
*Assistant Examiner* — Joselito S. Baisa
(74) *Attorney, Agent, or Firm* — Sughrue Mion, PLLC

(57) ABSTRACT

An integrated circuit includes a T-coil formed in a first metal layer, wherein the T-coil may include: a first inductor connected to a first terminal and a second terminal; and a second inductor connected to the second terminal and a third terminal, wherein the first inductor and the second inductor may include a first pattern and a second pattern, respectively, the first and second patterns extending parallel to each other in a first direction from the second terminal in the first metal layer, and wherein the first pattern and the second pattern may form a bridge capacitor of the T-coil.

20 Claims, 12 Drawing Sheets

(51) Int. Cl.
*H10D 1/20* (2025.01)
*H10W 44/20* (2026.01)

(58) Field of Classification Search
USPC .......................................................... 336/200
See application file for complete search history.

(56) References Cited

U.S. PATENT DOCUMENTS

| | | | | |
|---|---|---|---|---|
| 7,418,251 | B2 * | 8/2008 | Liu ...................... | H03H 7/1766 455/114.1 |
| 8,395,234 | B2 | 3/2013 | Okushima et al. | |
| 9,748,326 | B2 * | 8/2017 | Yen ..................... | H10W 20/497 |
| 10,498,139 | B2 | 12/2019 | Fan | |
| 10,529,480 | B2 | 1/2020 | Fan | |
| 10,601,222 | B2 | 3/2020 | Fan | |
| 10,944,397 | B1 | 3/2021 | Yuan et al. | |
| 11,328,859 | B2 * | 5/2022 | Lin ..................... | H01F 17/0013 |
| 11,361,899 | B2 | 6/2022 | Yoon et al. | |
| 2003/0222750 | A1 * | 12/2003 | Kyriazidou ............. | H10D 1/20 336/200 |
| 2006/0250198 | A1 * | 11/2006 | Meltzer .................... | H10D 1/20 333/185 |
| 2010/0052837 | A1 * | 3/2010 | Fan ......................... | H01F 5/003 336/200 |
| 2014/0306793 | A1 * | 10/2014 | Shamim ............... | H03H 7/0115 336/200 |
| 2016/0261256 | A1 * | 9/2016 | Kawai ..................... | H04L 25/03 |
| 2016/0276091 | A1 * | 9/2016 | Zhang ................. | H01F 27/2804 |
| 2019/0074686 | A1 * | 3/2019 | Fan ...................... | H10D 89/911 |
| 2019/0089150 | A1 | 3/2019 | Gharibdoust et al. | |
| 2019/0189734 | A1 | 6/2019 | Li et al. | |
| 2019/0206613 | A1 * | 7/2019 | Lin ..................... | H01F 17/0013 |
| 2020/0280295 | A1 | 9/2020 | Fan et al. | |

OTHER PUBLICATIONS

Huang et al., "Design and Analysis for a 60-GHz Low-Noise Amplifier With RF ESD Protection", IEEE Transaction on Microwave theory and Techniques, vol. 57, No. 2, Feb. 2009, pp. 298-305.

Galal et al., "Broadband ESD Protection Circuits in CMOS Technology", IEEE Journal of Solid- State Circuits, vol. 38, No. 12, Dec. 2003, pp. 2334-2340.

Communication issued Mar. 19, 2025 by the Korean Intellectual Property Office in counterpart Korean Patent Application No. 10-2021-0094458.

Communication issued Jun. 23, 2026 by the Korean Ministry of Intellectual Property for KR Patent Application No. 10-2021-0094458.

* cited by examiner

PLANAR T-COIL AND INTEGRATED CIRCUIT INCLUDING THE SAME

CROSS-REFERENCE TO RELATED APPLICATION

This application is based on and claims priority under 35 U.S.C. § 119 to Korean Patent Application No. 10-2021-0094458, filed on Jul. 19, 2021, in the Korean Intellectual Property Office, the disclosure of which is incorporated by reference herein in its entirety.

BACKGROUND

The inventive concept relates to a T-coil, and more particularly, to a planar T-coil and an integrated circuit including the same.

Capacitance in a signal path may occur due to a variety of causes. For example, the capacitance of the signal path may include parasitic capacitance of a conducting wire and/or capacitance provided by elements coupled to the signal path. The capacitance of the signal path may affect impedance matching, gain, noise, and the like, and consequently may deteriorate signal integrity (SI). Accordingly, in the high-speed transmission of signals, effectively reducing the effect of the capacitance of the signal path may be important.

SUMMARY

The inventive concept provides a planar T-coil that effectively reduces an effect on capacitance of a signal path and an integrated circuit including the same.

According to an aspect of the disclosure, there is provided an integrated circuit including: a T-coil formed in a first metal layer, wherein the T-coil includes: a first inductor connected to a first terminal and a second terminal; and a second inductor connected to the second terminal and a third terminal, wherein the first inductor includes a first pattern in the first metal layer and the second inductor includes a second pattern in the first metal layer, wherein the first pattern and the second pattern extend in parallel to each other in a first direction from the second terminal, and wherein the first pattern and the second pattern are configured to form a bridge capacitor of the T-coil.

According to an aspect of the disclosure, there is provided an integrated circuit including: a T-coil formed in a first metal layer, wherein the T-coil includes: a first inductor connected to a first terminal and a second terminal; and a second inductor connected to the second terminal and a third terminal, and wherein the first inductor includes: a first pattern in the first metal layer extending in a first direction from the second terminal; a second pattern in the first metal layer, connected to the first pattern and extending in a second direction perpendicular to the first direction; a third pattern in the first metal layer, connected to the second pattern and extending in a third direction opposite to the first direction; and a fourth pattern in the first metal layer, connected to the third pattern and the first terminal and extending in a fourth direction opposite to the second direction in the first metal layer.

According to an aspect of the disclosure, there is provided an integrated circuit including: a first T-coil including a first inductor and a second inductor, wherein the first inductor is connected to a first terminal and a second terminal, and the second inductor is connected to the second terminal and a third terminal; a first pad configured to electrically connect to the first terminal; a first electrostatic discharge (ESD) element configured to electrically connect to the second terminal; and a first active circuit configured to electrically connect to the third terminal, wherein the first inductor and the second inductor are formed in a first metal layer.

According to an aspect of the disclosure, there is provided an integrated circuit including: a capacitance reduction circuit including: a first inductor connected to a first terminal and a second terminal, the first inductor including a first pattern in the first metal layer; a second inductor connected to the second terminal and a third terminal, the second inductor including a second pattern in the first metal layer; and a first electrostatic discharge (ESD) element electrically connected to the second terminal, wherein at least one of an inductance of the first inductor and an inductance of the second inductor is set based on a capacitance of the ESD element.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
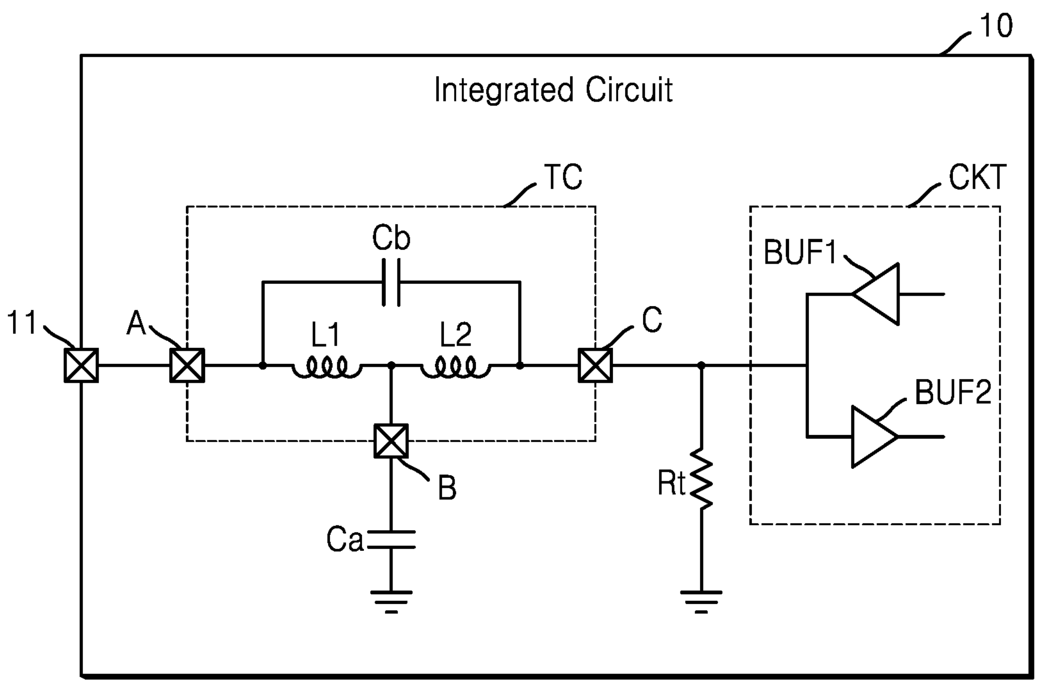
FIG. 1 is a block diagram illustrating an integrated circuit according to an example embodiment of the inventive concept.

FIG. 1 is a block diagram illustrating an integrated circuit 10 according to an example embodiment of the inventive concept. The integrated circuit 10 may be manufactured through a semiconductor process. As shown in FIG. 1, the integrated circuit 10 may include a pin 11, a T-coil TC, an electrostatic discharge (ESD) capacitor Ca, a termination resistor Rt, and an active circuit CKT.

The pin 11 may be made of a conductive material (e.g., metal) and may be exposed to the outside of the integrated circuit 10. For example, as shown in FIG. 1, the pin 11 may be an input/output (bidirectional) pin, and the integrated circuit 10 may receive a signal through the pin 11 in a reception mode, and output a signal through the pin 11 in a transmission mode. In some example embodiments, the pin 11 may be an input pin, and the integrated circuit 10 may receive a signal from the outside through the pin 11. In some example embodiments, the pin 11 may be an output pin, and integrated circuit 10 may output a signal to the outside through the pin 11. In some example embodiments, the pin 11 may be an input pin, and the integrated circuit 10 may receive a signal from an external device outside of the integrated circuit 10 through the pin 11. In some example embodiments, the pin 11 may be an output pin, and integrated circuit 10 may output a signal to an external device outside of the integrated circuit 10 through the pin 11.

When ESD occurs in the pin 11 exposed to the outside, elements inside the integrated circuit 10 may be damaged. For example, the ESD resistance of an element included in the integrated circuit 10 may depend on the breakdown voltage of a gate oxide film of a transistor, and as the thickness of the gate oxide film gradually decreases, the breakdown voltage may decrease. Accordingly, the integrated circuit 10 may include elements that are more sensitive to ESD. To prevent damage to the element due to ESD, the integrated circuit 10 may include an ESD element such as a diode or a capacitor. The ESD element may protect the elements of the integrated circuit 10 from ESD by receiving charges generated by the ESD.

The ESD element may provide a capacitance to the signal path including the pin 11, and the capacitance of the ESD element may limit the high-speed transmission of signals. For example, as shown in FIG. 1, the ESD element may be modeled as an ESD capacitor Ca, and the ESD capacitor Ca may be required to have a low capacitance as the frequency of a signal input/output through the pin 11 increases. However, due to the limited space for ESD-sensitive elements and/or ESD elements included in the integrated circuit 10, it may not be easy to design an ESD element with low capacitance. Accordingly, the integrated circuit 10 may include the T-coil TC to reduce or eliminate the capacitance of the ESD capacitor Ca.

The T-coil TC may have three terminals. For example, as shown in FIG. 1, the T-coil TC may include a first terminal A connected to the pin 11, a second terminal B connected to the capacitor Ca, and a third terminal C connected to the active circuit CKT. The T-coil TC may include a first inductor L1 connected to the first terminal A and the second terminal B, a second inductor L2 connected to the second terminal B and the third terminal C, and a bridge capacitor Cb connected to the first terminal A and the third terminal C. As described later with reference to the accompanying drawings, the bridge capacitor may be formed by the first inductor L1 and the second inductor L2 adjacent to each other, and may have a capacitance generated by a portion of the first inductor L1 and the second inductor L2. A high-frequency signal passing through the pin 11 may not be affected by the ESD capacitor Ca by the first inductor L1 and the second inductor L2 of the T-coil TC. In addition, a signal having a frequency equal to or less than a first frequency may pass through the first inductor L1 and the second inductor L2 of the T-coil TC, while a signal having a frequency equal to or higher than a second frequency, which is higher than the first frequency, may pass through the bridge capacitor Cb. The first frequency and the second frequency may be defined by the inductance of the first inductor L1, the inductance of the second inductor L2, and the capacitance of the bridge capacitor Cb.

In the T-coil TC, the inductance of the first inductor L1, the inductance of the second inductor L2, and the capacitance of the bridge capacitor Cb may be determined based on the capacitance of the ESD capacitor Ca. For example, the inductance $L_1$ of the first inductor L1 and the inductance L2 of the second inductor L2 in the T-coil TC may be calculated from the capacitance $C_a$ of the ESD capacitor Ca based on [Equation 1] below.

$$L_1 = L_2 = \frac{C_a R_t^2}{4}\left(1 + \frac{1}{4\zeta^2}\right) \quad \text{[Equation 1]}$$

In [Equation 1], $R_t$ may be the resistance of the termination resistor Rt, and the termination resistor Rt may have a variable resistance value for impedance matching. In some example embodiments, the termination resistor Rt may be omitted. Also, a coupling coefficient k between the first inductor L1 and the second inductor L2 may be calculated based on [Equation 2] below.

$$k = \frac{4\zeta^2 - 1}{4\zeta^2 + 1} \quad \text{\{Equation 2]}$$

Also, the capacitance $C_b$ of the bridge capacitor Cb may be calculated from the capacitance $C_a$ of the ESD capacitor Ca based on [Equation 3] below.

$$C_b = \frac{C_a}{16\zeta^2} \quad \text{[Equation 3]}$$

In [Equation 1], [Equation 2], and [Equation 3], ζ may be a damping factor of the network transfer function.

The active circuit CKT may be connected to the T-coil TC and may process a signal received through the pin 11 or may generate a signal to be output through the pin 11. For example, as shown in FIG. 1, the active circuit CKT may include a TX buffer BUF1 and an RX buffer BUF2. The TX buffer BUF1 may generate a signal to be output to the outside of the integrated circuit 10 through the pin 11 in the transmission mode, and the RX buffer BUF2 may process a signal received from the outside of the integrated circuit 10 through the pin 11 in the reception mode. In some example embodiments, when the pin 11 is an input pin, the TX buffer BUF1 in the active circuit CKT may be omitted. In some example embodiments, when the pin 11 is an output pin, the RX buffer BUF2 in the active circuit CKT may be omitted.

As will be described later with reference to the drawings, the T-coil TC may be formed on a single metal layer, and accordingly, when the integrated circuit 10 includes limited metal layers, the T-coil TC may be effectively designed. In addition, the T-coil TC formed on the single metal layer may provide higher reliability, and thus the operation reliability of the integrated circuit 100 may be improved. In addition, the T-coil TC may be designed to have improved characteristics, and thus the capacitance of the ESD capacitor Ca may be effectively reduced or eliminated. As a result, due to the reduced or eliminated capacitance of the ESD capacitor Ca, signals may be transmitted at high speed through the pin 11, and the performance of the integrated circuit 10 and the system including the integrated circuit 10 may be improved.

Figure 2A:
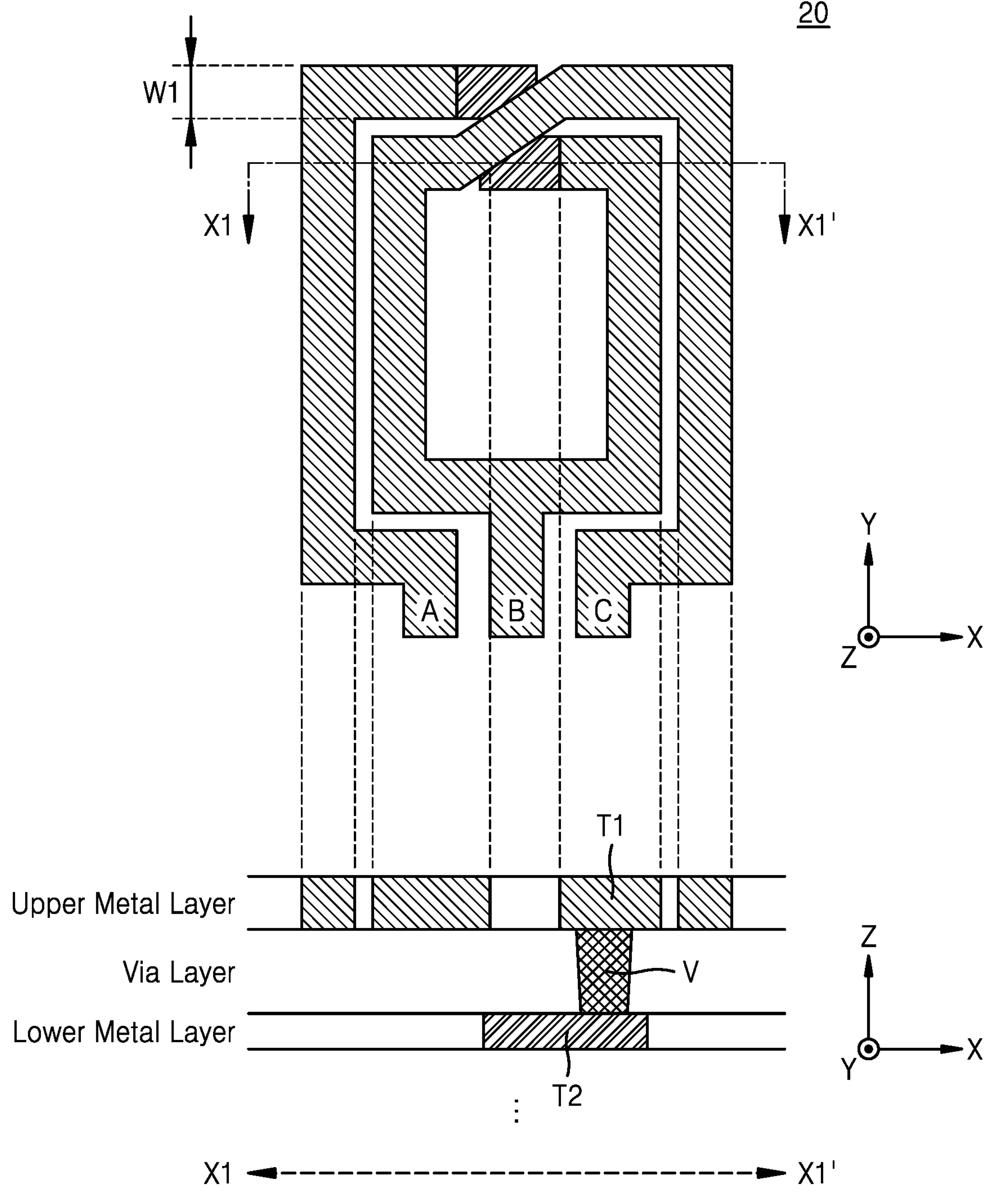
FIGS. 2A and 2B are views illustrating a T-coil according to a comparative example.
Figure 2B:
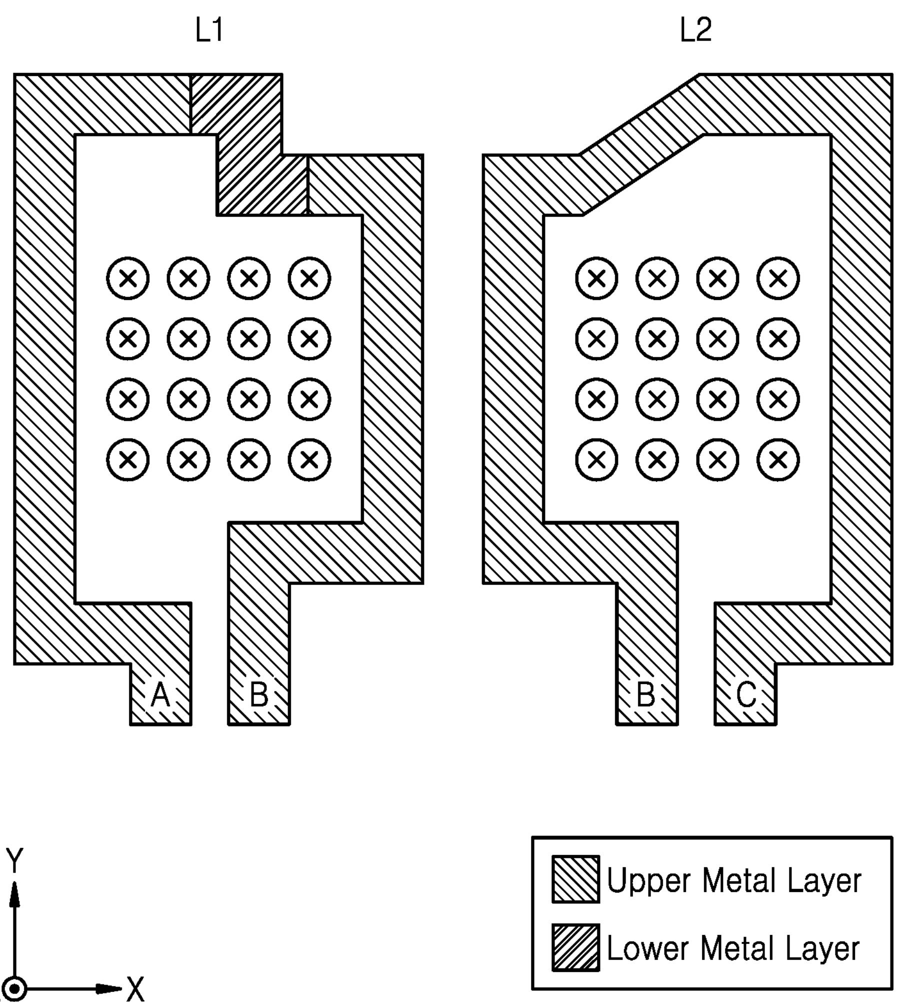

FIGS. 2A and 2B are views illustrating a T-coil 20 according to a comparative example. Specifically, FIG. 2A includes a plan view showing the T-coil 20 in a plane defined by an X-axis and a Y-axis and a cross-sectional view showing a cross-section of the T-coil 20 taken along line X1-X1', and FIG. 2B illustrates a first inductor L1 and a second inductor L2 included in the T-coil 20.

Herein, a direction parallel to the Y axis and a direction parallel to the X axis may be referred to as a first direction and a second direction, respectively, and a direction parallel to a Z axis may be referred to as a third direction or a vertical direction. A plane defined by the X and Y axes may be referred to as a horizontal plane, and a component arranged in the +Z direction relative to other components may be referred to as being above the other components, and a component arranged in the −Z direction relative to other components may be referred to as being under the other component. In addition, the area of the component may refer to the size occupied by the component in a plane parallel to the horizontal plane, and the width of the component may refer to a length in a direction orthogonal to a direction in which the component extends. Also, when components are coupled or electrically connected, the components may be referred simply to as being connected. In the drawings herein, only some layers may be shown for convenience of illustration. Also, a pattern composed of a conductive material, such as a pattern of a metal layer, may be referred to as a conductive pattern or simply to as a pattern.

Referring to FIG. 2A, the T-coil 20 may be formed in two metal layers. For example, the first terminal A, the second terminal B, and the third terminal C of the T-coil 20 may be formed in an upper metal layer, and the T-coil 20 may include patterns connected to the first terminal A, the second terminal B, and/or the third terminal C in the upper metal layer. In addition, the T-coil 20 may include a pattern of a lower metal layer at an intersection of the first inductor L1 and the second inductor L2. For example, the T-coil 20 may include two vias connecting the pattern of the upper metal layer and the pattern of the lower metal layer in a via metal layer between the upper metal layer and the lower metal layer.

To prevent the generation of reflected waves, the T-coil 20 may include patterns extending with a constant width. For example, as shown in FIG. 2A, the T-coil 20 may include patterns extending in a direction parallel to the X-axis or the Y-axis with the first width W1 in the upper metal layer. In addition, the T-coil 20 may include patterns extending in a direction parallel to the X-axis or the Y-axis with the first width W1 in the lower metal layer. As described above, the T-coil 20 may include a via that connects the pattern of the upper metal layer and the pattern of the lower metal layer, and thus the first width W1 may depend on the area of the via. For example, as shown in the cross-sectional view of FIG. 2A, the first pattern T1 of the upper metal layer and the second pattern T2 of the lower metal layer may have an area greater than or equal to the area of a via V at a portion in contact with the via V in order to be completely connected to the via V through a semiconductor process. Accordingly, the first width W1 may be greater than a second width W2 to be described later with reference to FIGS. 3A and 3B.

Referring to FIG. 2B, the first inductor L1 and the second inductor L2 included in the T-coil 20 are illustrated separately, and the second terminal B is illustrated in duplicate for convenience of illustration. When a current flows from the first terminal A to the second terminal B in the first inductor L1, magnetic flux may be generated in the first inductor L1 as shown in FIG. 2B. In addition, when a current flows from the second terminal B to the third terminal C in the second inductor L2, magnetic flux may be generated in the second inductor L2 as shown in FIG. 2B.

As shown in FIG. 2B, the first inductor L1 and the second inductor L2 may have different shapes. In particular, the second inductor L2 includes only a pattern formed on the upper metal layer, while the first inductor L1 may include patterns and vias formed on the lower metal layer as well as the pattern formed on the upper metal layer. Accordingly, the first inductor L1 and the second inductor L2 may be asymmetric, and it may not be easy to design the first inductor L1 and the second inductor L2 having the same inductance.

Figure 3A:
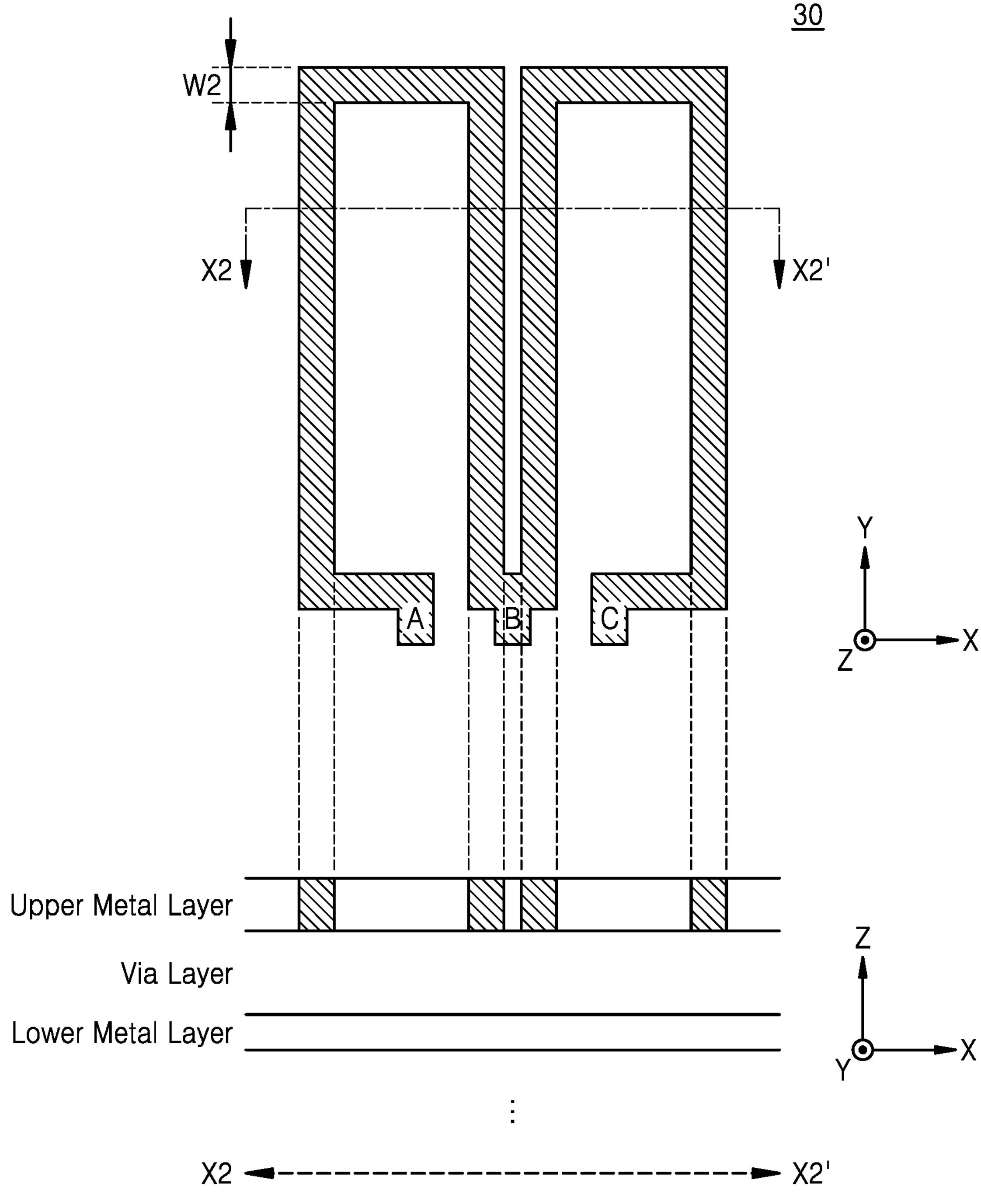
FIGS. 3A and 3B are diagrams illustrating a T-coil according to an example embodiment of the inventive concept.
Figure 3B:
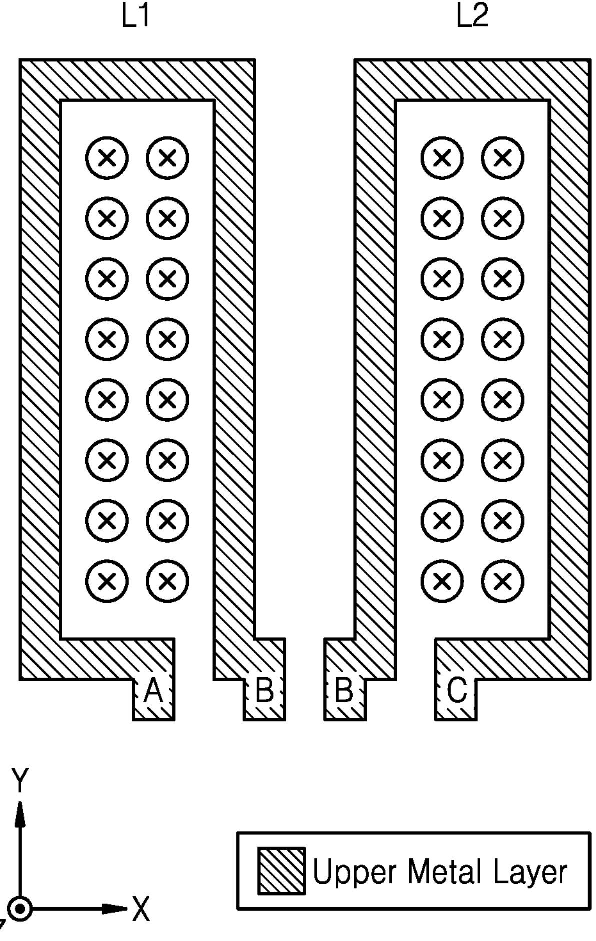

FIGS. 3A and 3B are diagrams illustrating a T-coil 30 according to an example embodiment of the inventive concept. Specifically, FIG. 3A includes a plan view illustrating a T-coil 30 in a plane defined by the X-axis and the Y-axis and a cross-sectional view illustrating a cross section of the T-coil 30 taken along line X2-X2', and FIG. 3B illustrates a first inductor L1 and a second inductor L2 included in the T-coil 30.

Referring to FIG. 3A, the T-coil 30 may be formed on a single metal layer. For example, a first terminal A, a second terminal B, and a third terminal C of the T-coil 30 may be formed in an upper metal layer, and the T-coil 30 may include patterns connected to the first terminal A, the second terminal B, and/or the third terminal C in the upper metal layer. In the T-coil 30 formed on the single metal layer, the via and the pattern formed on a lower metal layer, which is below the single metal layer, may be omitted, and the T-coil 30 may have a simpler structure than the T-coil 20 of FIG. 2A. Due to the simple structure of the T-coil 30, the T-coil 30 may be manufactured at a lower cost (e.g., with low complexity of a semiconductor process) and may provide higher reliability.

According to an example embodiment, in order to prevent the generation of reflected waves, the T-coil 30 may include patterns extending with a constant width. For example, as shown in FIG. 3A, the T-coil 30 may include patterns extending in a direction parallel to the X-axis or the Y-axis with the second width W2 in the upper metal layer. Since the via for connecting to the pattern of the lower metal layer is omitted, the patterns of the T-coil 30 may have a second width W2 independent of the via, accordingly, the patterns of the T-coil 30 may have a second width W2 smaller than the first width W1 in FIG. 2A. That is, the patterns of the T-coil 30 may have a second width W2 smaller than the first width W1, which may be necessary for forming a via to a lower metal layer. Accordingly, the T-coil 30 may have a higher degree of freedom in design than the T-coil 20 of FIG. 2A, and the T-coil 30 may be designed optimally. In addition, as will be described later with reference to FIGS. 4A and 4B, the T-coil 30 of FIG. 3A may have better properties than the T-coil 20 of FIG. 2A.

In some example embodiments, the metal layer in which the T-coil 30 is formed may be the uppermost metal layer in the integrated circuit. For example, as shown in the cross-sectional view of FIG. 3A, the T-coil 30 may include patterns formed in the upper metal layer, and in the integrated circuit, the upper metal layer may be an uppermost metal layer among metal layers under a metal layer on which a pad exposed to the outside is formed. In some example embodiments, the integrated circuit may further include at least one re-wiring layer for routing of the pad between the metal layer on which the pad is formed and the upper metal layer on which the T-coil 30 is formed. Herein, the metal layers may have a greater thickness (i.e., a length in a direction parallel to the Z-axis) toward the top, and accordingly, the cross-sectional area of the pattern included in the T-coil 30 may increase. In this specification, the upper metal layer may be referred to as a first metal layer.

Referring to FIG. 3B, the first inductor L1 and the second inductor L2 included in the T-coil 30 are illustrated separately, and the second terminal B is illustrated in duplicate for convenience of illustration. When a current flows from the first terminal A to the second terminal B in the first inductor L1, magnetic flux may be generated in the first inductor L1 as shown in FIG. 3B. In addition, when a current flows from the second terminal B to the third terminal C in the second inductor L2, magnetic flux may be generated in the second inductor L2 as shown in FIG. 3B.

As shown in FIG. 3B, the first inductor L1 and the second inductor L2 may have a symmetrical structure with respect to a line parallel to the Y-axis. For example, the first inductor L1 and the second inductor L2 may include only a pattern formed on the upper metal layer, and thus may be easily designed to have a mutually symmetrical structure. Accordingly, the first inductor L1 and the second inductor L2 satisfying [Equation 1] and [Equation 2] may be easily designed.

Figure 4A:
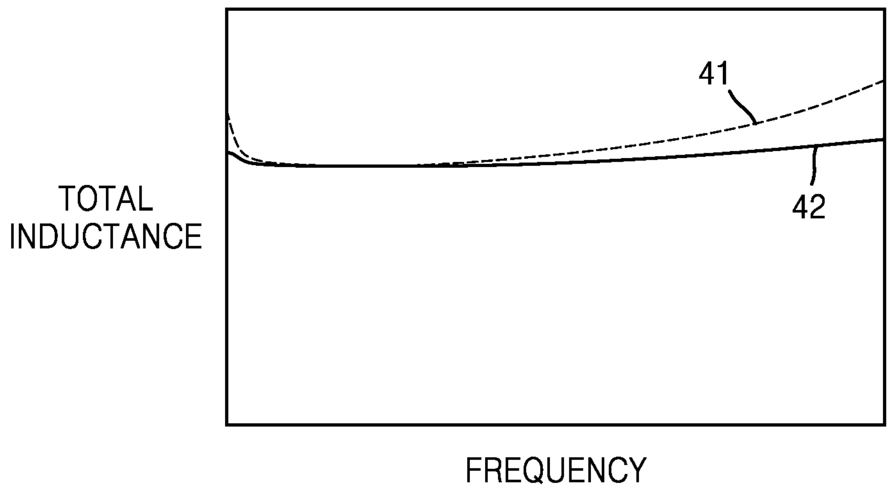
FIGS. 4A and 4B are graphs showing the characteristics of T-coils.
Figure 4B:
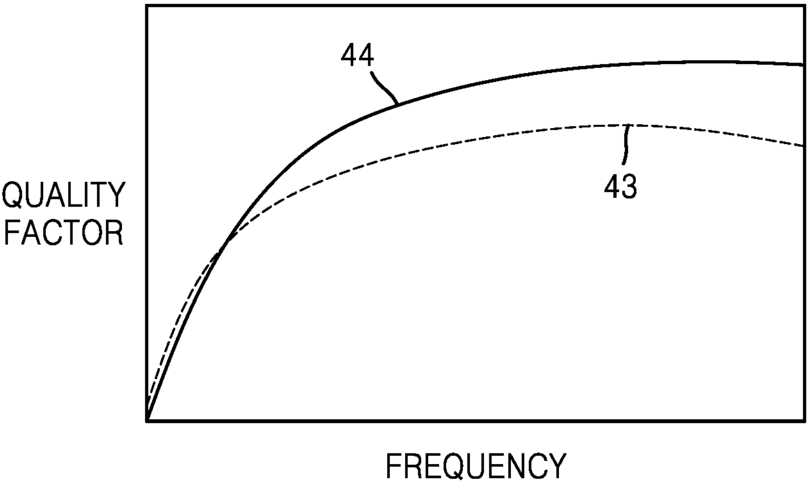

FIGS. 4A and 4B are graphs showing the characteristics of T-coils. Specifically, the graph of FIG. 4A shows the total inductance according to the frequency of the T-coil 20 of FIG. 2A and the T-coil 30 of FIG. 3A, and the graph of FIG. 4B shows the quality factor (Q-factor) according to the frequency of the T-coil 20 of FIG. 2A and the T-coil 30 of FIG. 3A. Hereinafter, FIGS. 4A and 4B will be described with reference to FIGS. 2A and 3A.

Referring to FIG. 4A, the curve 41 may correspond to the T-coil 20 of FIG. 2A, and the curve 42 may correspond to the T-coil 30 of FIG. 3A. As shown in FIG. 4A, the T-coil 20 of FIG. 2A may have a relatively large variation in total inductance according to a change in frequency, but the T-coil 30 of FIG. 3A may have a relatively small variation in total inductance according to a change in frequency. Accordingly, the T-coil 30 of FIG. 3A may provide more stable performance in a wide frequency range.

Referring to FIG. 4B, the curve 43 may correspond to the T-coil 20 of FIG. 2A, and the curve 44 may correspond to the T-coil 30 of FIG. 3A. The Q-factor may be defined as 'inductance/resistance', and a higher Q-factor may be appropriate. As shown in FIG. 4B, the T-coil 20 of FIG. 2A may have a relatively low Q-factor at a high frequency, but the T-coil 30 of FIG. 3A may have a relatively high Q-factor at a high frequency. Accordingly, the T-coil 30 of FIG. 3A may provide higher performance in a high frequency range.

Figure 5:
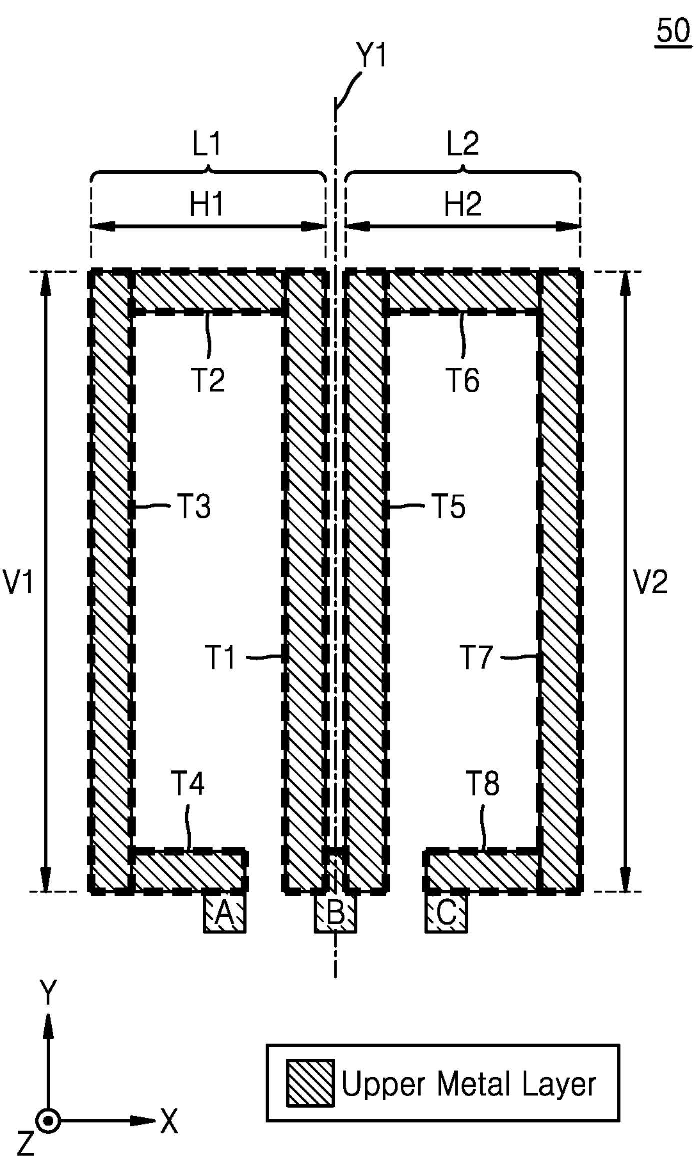
FIG. 5 is a diagram illustrating a T-coil according to an example embodiment of the inventive concept.

FIG. 5 is a diagram illustrating a T-coil 50 according to an example embodiment of the inventive concept. As described above with reference to the drawings, the T-coil 50 may include a first terminal A, a second terminal B and a third terminal C, and may include a first inductor L1 and a second inductor L2.

The first inductor L1 and the second inductor L2 may include patterns formed on the upper metal layer. For example, as shown in FIG. 5, the first inductor L1 may include a first pattern T1, a second pattern T2, a third pattern T3, and a fourth pattern T4 in the upper metal layer. The first pattern T1 may extend from the second terminal B in a direction parallel to the Y-axis. The second pattern T2 may be connected to the first pattern T1 and may extend in a direction parallel to the X-axis. The third pattern T3 may be connected to the second pattern T2 and may extend in a direction parallel to the Y-axis. The fourth pattern T4 may be connected to the third pattern T3 and the first terminal A and may extend in a direction parallel to the X-axis. Also, the second inductor L2 may include a fifth pattern T5, a sixth pattern T6, a seventh pattern T7, and an eighth pattern T8 in the upper metal layer. The fifth pattern T5 may extend from the second terminal B in a direction parallel to the Y-axis. The sixth pattern T6 may be connected to the fifth pattern T5 and may extend in a direction parallel to the X-axis. The seventh pattern T7 may be connected to the sixth pattern T6 and may extend in a direction parallel to the Y-axis. The eighth pattern T8 may be connected to the seventh pattern T7 and may extend in a direction parallel to the X-axis.

The first inductor L1 and the second inductor L2 may have a symmetrical structure with respect to a line Y1 passing through the second terminal B in a direction parallel to the Y-axis. Accordingly, the length H1 in a direction parallel to the X-axis of the first inductor L1 may be the same as the length H2 in a direction parallel to the X-axis of the second inductor L2, and the length V1 of the first inductor L1 in a direction parallel to the Y axis may be the same as the length V2 of the second inductor L2 in a direction parallel to the Y axis. When the lengths in the direction parallel to the X-axis of the first inductor L1 and the second inductor L2 are equal to H and the lengths in the direction parallel to the Y axis of the first inductor L1 and the second inductor L2 are equal to V, the inductance $L_1$ of the first inductor L1 and the inductance L2 of the second inductor L2 may be calculated based on [Equation 4] below.

[Equation 4]

$$L_1 = L_2 = \frac{\mu_0}{\pi}\left[-2(H+V)+2\sqrt{H^2+V^2}-H\ln\left(\frac{H+\sqrt{H^2+V^2}}{V}\right)-V\ln\left(\frac{V+\sqrt{H^2+V^2}}{V}\right)+H\ln\left(\frac{2H}{W/2}\right)+V\ln\left(\frac{2V}{W/2}\right)\right]$$

In [Equation 4], $\mu_0$ may be an intrinsic permeability, and W may be widths of patterns of the first inductor L1 and the second inductor L2. As described above with reference to the drawings, the first pattern T1, the second pattern T2, the third pattern T3, and the fourth pattern T4 of the first inductor L1, and the fifth pattern T5, the sixth pattern T6, the seventh pattern T7, and the eighth pattern T8 of the second inductor L2 may extend in a direction parallel to the X-axis or the Y-axis, respectively, with the same width.

The bridge capacitor Cb of the T-coil 50 may be formed by a part of the first inductor L1 and a part of the second inductor L2. For example, as shown in FIG. 5, the first pattern T1 of the first inductor L1 and the fifth pattern T5 of the second inductor L2 may be adjacent to each other in a direction parallel to the X-axis, and may extend in parallel to each other. The capacitance of the bridge capacitor Cb may be determined based on the lengths of the first pattern T1 and the fifth pattern T5 and the distance between the first pattern T1 and the fifth pattern T5, and accordingly, the bridge capacitor Cb satisfying [Equation 3] may be easily designed.

Figure 6:
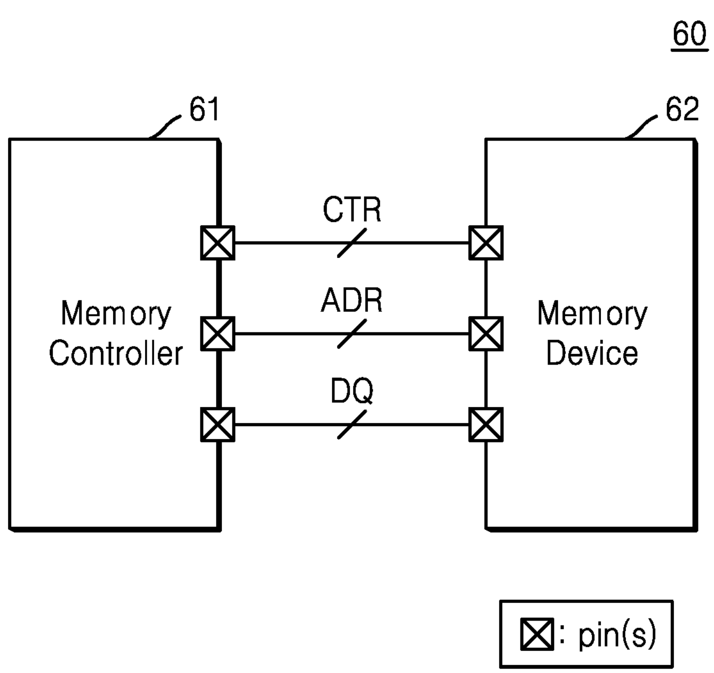
FIG. 6 is a block diagram illustrating a system according to an example embodiment of the inventive concept.

FIG. 6 is a block diagram illustrating a system 60 according to an example embodiment of the inventive concept. As shown in FIG. 6, the system 60 may include a memory controller 61 and a memory device 62. In some example embodiments, the memory controller 61 and the memory device 62 may be each independently a die (or chip) manufactured by a semiconductor process, may communicate with each other through conducting wires and may include pins connected to the conducting wires. Herein, the memory device 62 may be referred to as a semiconductor memory device.

The memory controller 61 may write data to the memory device 62 and read data stored in the memory device 62. For example, the memory controller 61 may provide a control signal CTR and an address signal ADR to the memory device 62 to write data, and may provide data to be written to the memory device 62 through the data signal DQ. In addition, the memory controller 61 may provide a control signal CTR and an address signal ADR to the memory device 62 to read data, and may receive the read data from the memory device 62 through the data signal DQ. In some example embodiments, the memory controller 61 may provide a command to the memory device 62 through the address signal ADR. In some example embodiments, the memory controller 61 may be included in a system-on-chip (SoC), such as an application processor (AP), and may also be referred to as a memory interface.

The memory device 62 may store data received from the memory controller 61 and may provide the stored data to the memory controller 61. For example, the memory device 62 may store, in response to the control signal CTR, data received through the data signal DQ, in an area corresponding to the address signal ADR. In addition, the memory device 62 may provide, in response to the control signal CTR, data stored in an area corresponding to the address signal ADR, to the memory controller 61 through the data signal DQ. In some example embodiments, the memory device 62 may store data or output stored data, in response to a command received through the address signal ADR.

The memory device 62 may have any structure capable of storing data. For example, the memory device 62 may include a volatile memory such as dynamic random access memory (DRAM) or static random access memory (SRAM), and/or may include a non-volatile memory such as flash memory or resistive random access memory (RRAM). In some example embodiments, the memory device 62 may further receive a clock signal, a data strobe signal, and the like from the memory controller 61.

The memory controller 61 and the memory device 62 may include a plurality of pins for transmitting or receiving the control signal CTR, the address signal ADR, and the data signal DQ. As described above with reference to the drawings, the memory controller 61 and the memory device 62 may each include a plurality of ESD elements corresponding to a plurality of pins to protect internal elements from ESD. As the bandwidth of a signal between the memory controller 61 and the memory device 62 increases, capacitance due to an ESD element may have a significant impact on SI. The T-coil described above with reference to the drawings may be included in the memory controller 61 and/or the memory device 62. Accordingly, the capacitance of the ESD element may be effectively reduced or eliminated, and a decrease in bandwidth between the memory controller 61 and the memory device 62 may be prevented. Hereinafter, the T-coil included in the memory device 62 will be mainly described, but it is noted that example embodiments of the inventive concept are not limited thereto.

Figure 7A:
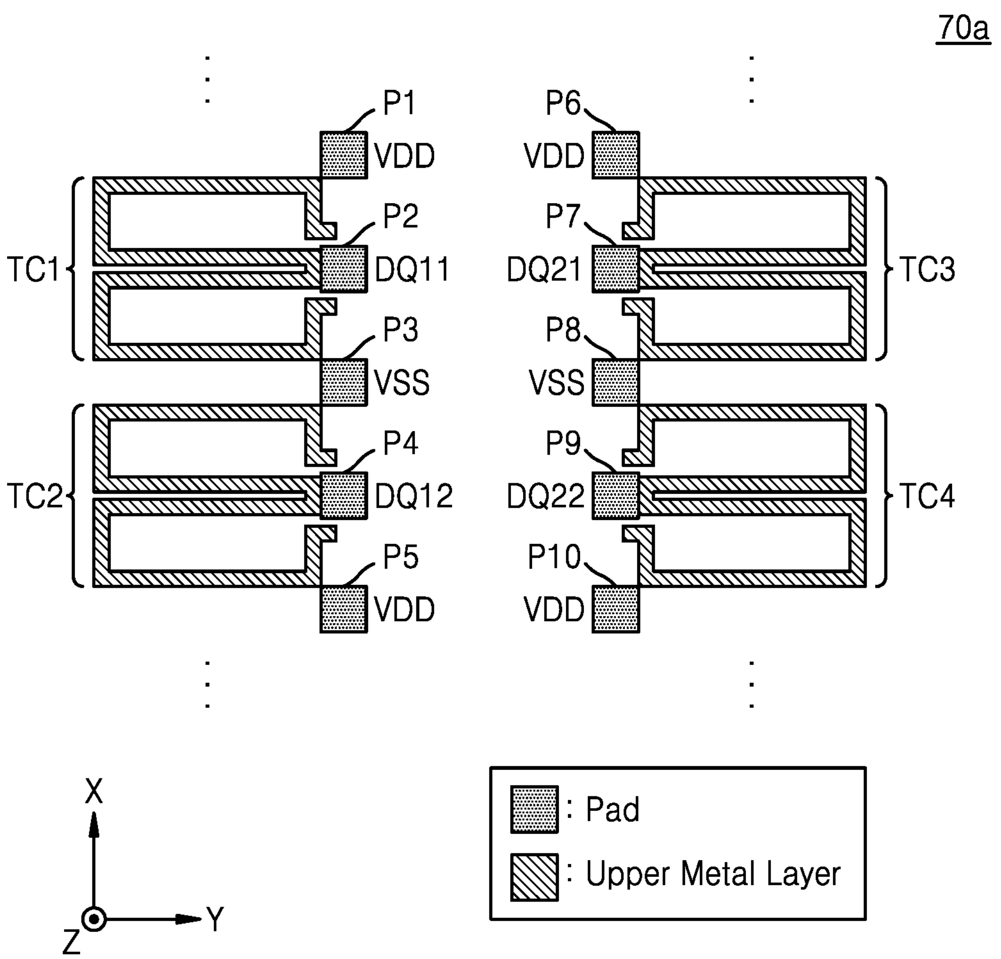
FIGS. 7A and 7B are plan views illustrating examples of a memory device according to example embodiments of the inventive concept.
Figure 7B:
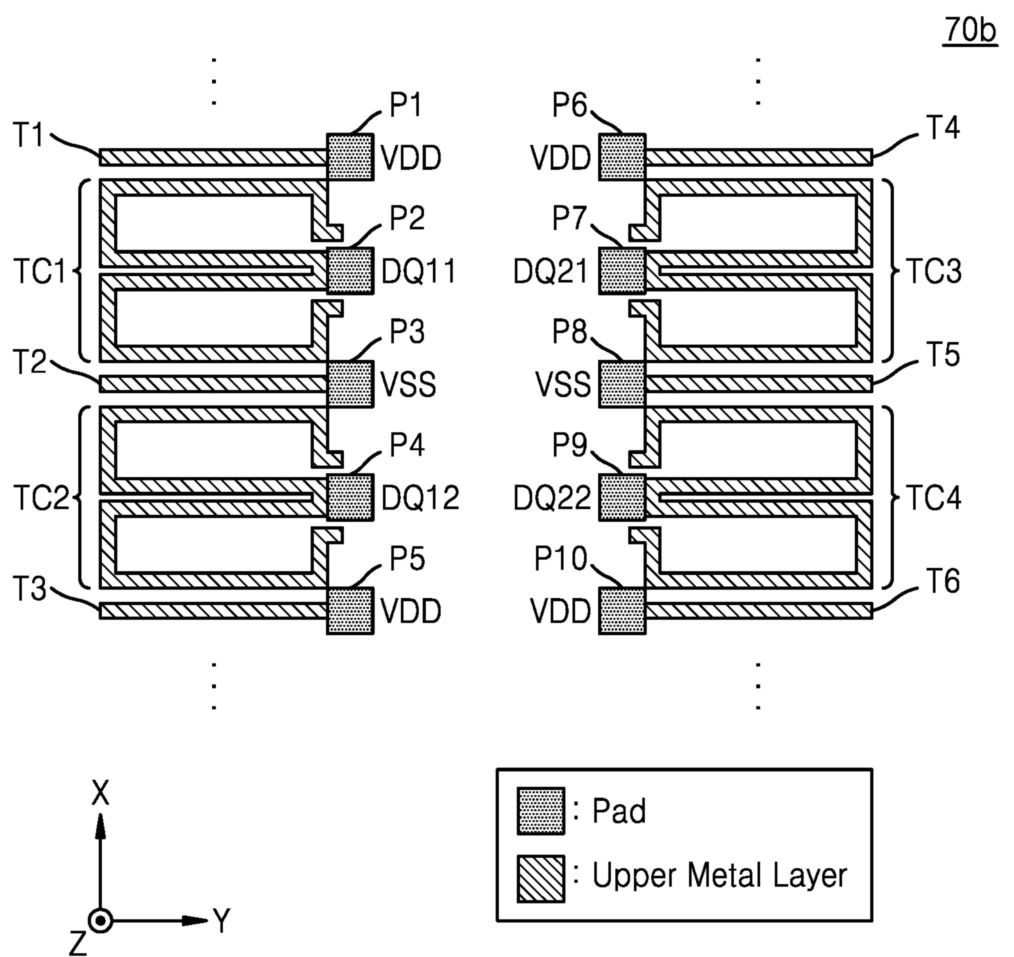

FIGS. 7A and 7B are plan views illustrating examples of a memory device according to exemplary embodiments of the inventive concept. Specifically, the plan views of FIGS. 7A and 7B schematically illustrate some pads included in memory devices 70*a* and 70*b* and some patterns connected to the some pads. As described above with reference to FIG. 6, each of the memory devices 70*a* and 70*b* may include an ESD element, and may include a T-coil formed on an upper metal layer to reduce or eliminate the capacitance of the ESD element. Hereinafter, duplicate content in the description of FIGS. 7A and 7B will be omitted.

Referring to FIG. 7A, the memory device 70*a* may include pads aligned in a direction parallel to the X-axis. The pad may be exposed to the outside in the memory device 70*a* formed as a die (or chip), and may be made of a conductive material. As shown in FIG. 7A, a series of pads including a first pad P1, a second pad P2, a third pad P3, a fourth pad P4 and a fifth pad P5 may be aligned in a direction parallel to the X axis, and a series of pads including a sixth pad P6, a seventh pad P7, an eighth pad P8, a ninth pad P9, and a tenth pad P10 may be aligned in a direction parallel to the X axis. In addition, the first pad P1, the second pad P2, the third pad P3, the fourth pad P4, and the fifth pad P5 may face the sixth pad P6, the seventh pad P7, the eighth pad P8, the ninth pad P9, and the tenth pad P10 in a direction parallel to the Y-axis, respectively.

In some example embodiments, a T-coil may be connected to a pad, of the memory device 70*a*, through which a data signal passes. For example, as shown in FIG. 7A, the memory device 70*a* may include a first T-coil TC1 for the second pad P2 through which a data signal DQ11 passes, a second T-coil TC2 for the fourth pad P4 through which a data signal DQ12 passes, a third T-coil TC3 for the seventh pad P7 through which a data signal DQ21 passes, and a fourth T-coil TC4 for the ninth pad P9 through which a data signal DQ22 passes. In some example embodiments, to supply power to the memory device 70*a*, the T-coil for the pad to which a positive supply voltage VDD or a negative supply voltage (or ground potential) VSS is applied may be omitted. For example, as shown in FIG. 7A, T-coils for the first pad P1, the fifth pad P5, the sixth pad P6, and the tenth pad P10 to which the positive supply voltage VDD is applied may be omitted, and T-coils for the third pad P3 and the eighth pad P8 to which the negative supply voltage VSS is applied may be omitted.

In some example embodiments, the T-coil may extend away from the pad opposite to the pad connected to the T-coil. For example, the first T-coil TC1 for the second pad P2 may include a pattern extending in a direction away from the seventh pad P7 (i.e., the −Y-axis direction) opposite to the second pad P2 in a direction parallel to the Y-axis. The second T-coil TC2 for the fourth pad P4 may include a pattern extending in a direction away from the ninth pad P9 (i.e., the −Y-axis direction) opposite to the fourth pad P4 in a direction parallel to the Y-axis. The third T-coil TC3 for the seventh pad P7 may include a pattern extending in a direction away from the second pad P2 (i.e., the +Y-axis direction) opposite to the seventh pad P7 in a direction parallel to the Y-axis. The fourth T-coil TC4 for the ninth pad P9 may include a pattern extending in a direction away from the fourth pad P4 (i.e., the +Y-axis direction) opposite to the ninth pad P9 in a direction parallel to the Y-axis. As mentioned above, the T-coil may extend from the pad toward the edge of the memory device 70*a*, so that accordingly, patterns (not shown) of the upper metal layer arranged between a series of pads aligned in a direction parallel to the X-axis and a series of pads aligned in a direction parallel to the X-axis may not be affected.

Referring to FIG. 7B, the memory device 70*b* may include a first pad P1, a second pad P2, a third pad P3, a fourth pad P4, and a fifth pad P5 aligned in a direction parallel to the X-axis, and may include a sixth pad P6, a seventh pad P7, an eighth pad P8, a ninth pad P9, and a tenth pad P10 aligned in a direction parallel to the X-axis. Also, the memory device 70*b* may include a first T-coil TC1, a second T-coil TC2, a third T-coil TC3, and a fourth T-coil TC4 for data signals.

In some example embodiments, pads for power supply and pads for data signals may be alternately arranged in a series of pads aligned in a direction parallel to the X-axis. For example, as shown in FIG. 7B, the second pad P2 for the data signal DQ11 may be arranged between the first pad P1 for the positive supply voltage VDD and the third pad P3 for the negative supply voltage VSS. The third pad P3 for the negative supply voltage VSS may be arranged between the second pad P2 for the data signal DQ11 and the fourth pad P4 for the data signal DQ12. The fourth pad P4 for the data signal DQ12 may be arranged between the third pad P3 for the negative supply voltage VSS and the fifth pad P5 for the positive supply voltage VDD. Also, the seventh pad P7 for the data signal DQ21 may be arranged between the sixth pad P6 for the positive supply voltage VDD and the eighth pad P8 for the negative supply voltage VSS. The eighth pad P8 for the negative supply voltage VSS may be arranged between the seventh pad P7 for the data signal DQ21 and the ninth pad P9 for the data signal DQ22. The ninth pad P9 for the data signal DQ22 may be arranged between the eighth pad P8 for the negative supply voltage VSS and the tenth pad P10 for the positive supply voltage VDD.

In some example embodiments, the memory device **70*b* may include a shield pattern arranged between adjacent T-coils. For example, as shown in FIG. 7B, the memory device 70*b* may include a first pattern T1 connected to the first pad P1 for the positive supply voltage VDD, and the first pattern T1 may extend in a direction parallel to the Y-axis adjacent to the first T-coil TC1. The memory device 70*b* may include a second pattern T2 connected to the third pad P3 for the negative supply voltage VSS, and the second pattern T2 may extend between the first T-coil TC1 and the second T-coil TC2 in a direction parallel to the Y-axis. The memory device 70*b* may include a third pattern T3 connected to the fifth pad P5 for the positive supply voltage VDD, and the third pattern T3 may extend in a direction parallel to the Y-axis adjacent to the second T-coil TC2. In addition, the memory device 70*b* may include a fourth pattern T4 connected to the sixth pad P6 for the positive supply voltage VDD, and the fourth pattern T4 may extend in a direction parallel to the Y-axis adjacent to the third T-coil TC3. The memory device 70*b* may include a fifth pattern T5 connected to the eighth pad P8 for the negative supply voltage VSS, and the fifth pattern T5 may extend between the third T-coil TC3 and the fourth T-coil TC4 in a direction parallel to the Y-axis. The memory device 70*b*** may include a sixth pattern T6 connected to the tenth pad P10 for the positive supply voltage VDD, and the sixth pattern T6 may extend in a direction parallel to the Y-axis adjacent to the fourth T-coil TC4. Due to the positive supply voltage VDD and negative supply voltage VSS serving as signal ground, each of the first pattern T1, the second pattern T2, the third pattern T3, the fourth pattern T4, the fifth pattern T5, and the sixth pattern T6 may function as a shield for adjacent T-coils, and accordingly, interference between the T-coils may be reduced or eliminated.

Figure 8:
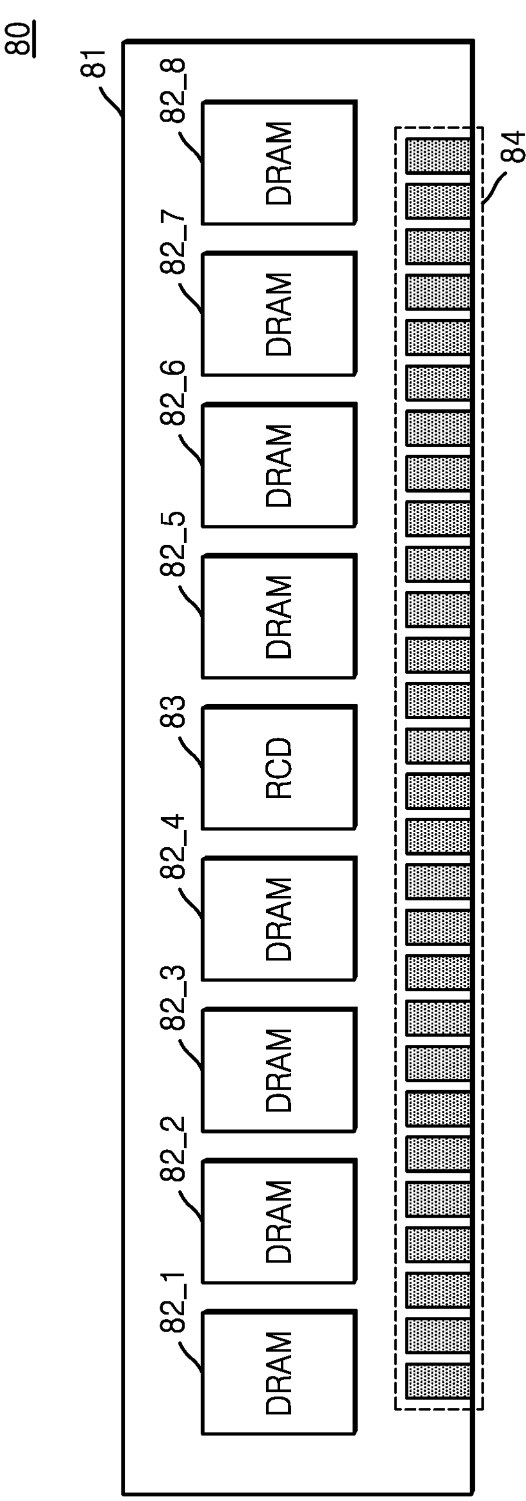
FIG. 8 is a diagram illustrating a memory module according to an example embodiment of the inventive concept.

FIG. 8 is a diagram illustrating a memory module 80 according to an example embodiment of the inventive concept. As shown in FIG. 8, the memory module 80 may include a printed circuit board (PCB) 81, a plurality of DRAM chips 81_1 to 82_8, and a buffer chip 83.

The plurality of DRAM chips 81_1 to 82_8 and the buffer chip 83 may be mounted on the PCB 81, and connectors 84 may be formed along one edge of the PCB 81. When the memory module 80 is inserted into a socket, the connectors 84 may contact pins included in the socket, and a control signal, an address signal, a clock signal, a data signal, and the like may be transmitted to the plurality of DRAM chips 81_1 to 82_8 and/or the buffer chip 83 through the connectors 84. The plurality of DRAM chips 82_1 to 82_8 and/or the buffer chip 83 may include an ESD element, and may include the T-coil described above with reference to the drawings to reduce or eliminate the capacitance of the ESD element.

The plurality of DRAM chips 82_1 to 82_8 may include a clock synchronous DRAM such as a synchronous dynamic random access memory (SDRAM). For example, each of the plurality of DRAM chips 82_1 to 82_8 may include a double data rate (DDR) SDRAM, a low power double data rate (LPDDR) SDRAM, a graphics double data rate (GDDR) SDRAM, a rambus dynamic random access memory (RDRAM), and the like. The buffer chip 83 may receive and buffer signals from an external device (e.g., 61 in FIG. 6) of the memory module 80, and may provide the buffered signals to the plurality of DRAM chips 82_1 to 82_8. According to an example embodiment, the buffer chip 83 may include a Register Clock Driver (RCD). However, the disclosure is not limited thereto.

Figure 9:
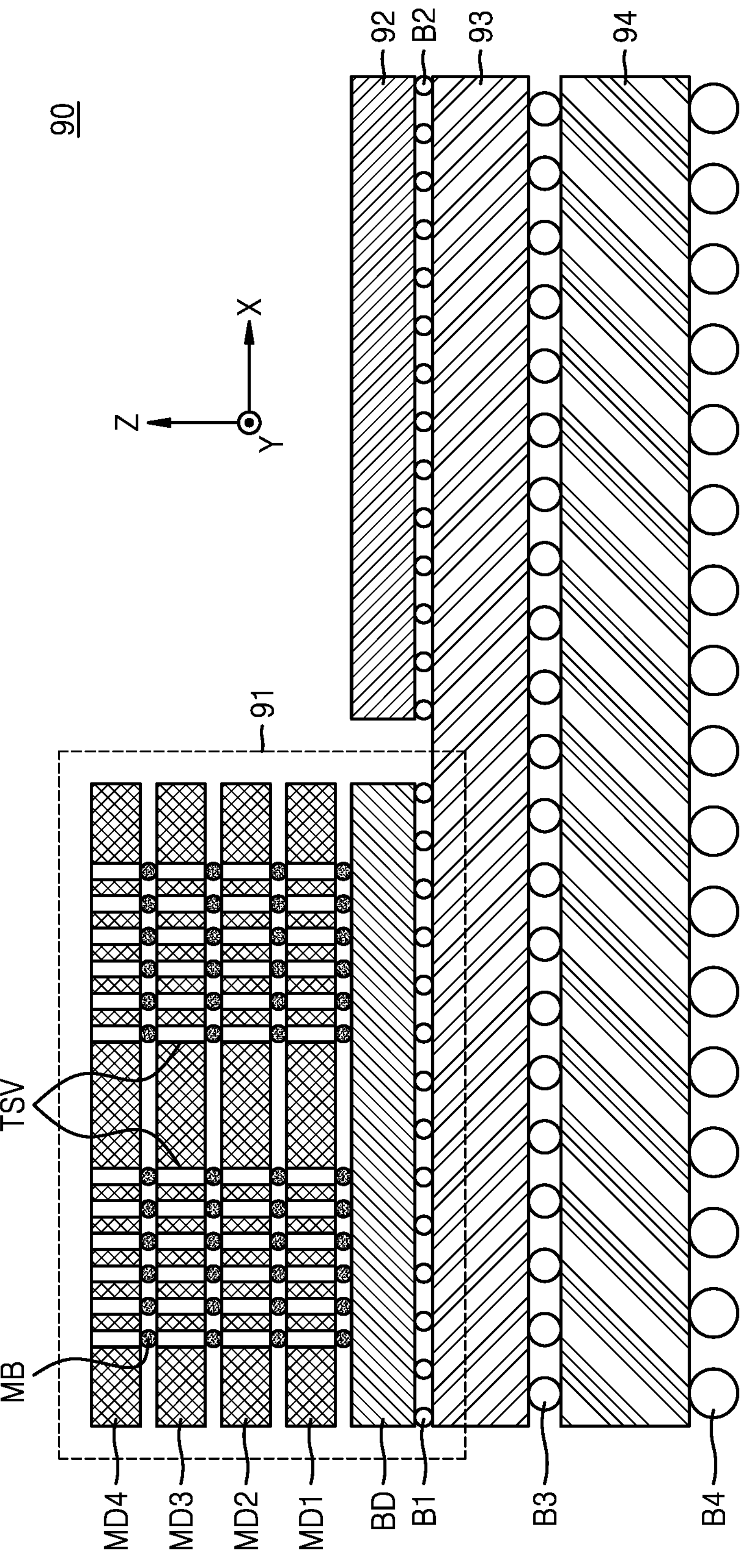
FIG. 9 is a diagram illustrating a cross-section of a system according to an example embodiment of the inventive concept.

FIG. 9 is a diagram illustrating a cross-section of a system 90 according to an example embodiment of the inventive concept. As shown in FIG. 9, the system 90 may include a high bandwidth memory (HBM) device 91, a processing circuit 92, an interposer 93, and a PCB 94.

The HBM device 91 may include a first memory die MD1, a second memory die MD2, a third memory die MD3, a fourth memory die MD4, and a base die BD, and may also be referred to as an HBM system. As shown in FIG. 9, the first memory die MD1, the second memory die MD2, the third memory die MD3, and the fourth memory die MD4 may be stacked on the base die BD, and micro bumps MB may be arranged between the first memory die MD1, the second memory die MD2, the third memory die MD3, the fourth memory die MD4, and the base die BD. The micro bumps MB may be connected to through silicon vias (TSV) passing through each of the first memory die MD1, the second memory die MD2, the third memory die MD3, and the fourth memory die MD4. In some example embodiments, the first to fourth memory dies MD1 to MD4 may be collectively referred to as an HBM.

The base die BD may be arranged on the interposer 93, and first bumps B1 may be arranged between the base die BD and the interposer 93. Address signals, control signals, and data signals for accessing the first memory die MD1, the second memory die MD2, the third memory die MD3, and the fourth memory die MD4 may pass through the first bumps B1. In some example embodiments, the first memory die MD1, the second memory die MD2, the third memory die MD3, the fourth memory die MD4 and/or the base die BD may include an ESD element, and may include the T-coil described above with reference to the drawings.

The processing circuit 92 may be arranged on the interposer 93, and second bumps B2 may be arranged between the processing circuit 92 and the interposer 93. The processing circuit 92 may communicate with the base die BD through some of the second bumps B2, patterns formed on the interposer 93, and some of the first bumps B1, and may write data to the HBM device 91 or read data from the HBM device 91. For example, the processing circuit 92 may include a central processing unit (CPU), a graphics processing unit (GPU), a neural processing unit (NPU), or the like. In some example embodiments, the processing circuit 92 may include an ESD element and may include the T-coil described above with reference to the drawings.

The interposer 93 may be arranged on the PCB 94, and third bumps B3 may be arranged between the interposer 93 and the PCB 94. In some example embodiments, the third bumps B3 may be flip die bumps. The interposer 93 may include a plurality of patterns for interconnecting the HBM device 91 and the processing circuitry 92. Fourth bumps B4 may be arranged on lower surface of the PCB 94, and the system 90 may communicate with the outside through the fourth bumps B4.

While the inventive concept has been particularly shown and described with reference to embodiments thereof, it will be understood that various changes in form and details may be made therein without departing from the spirit and scope of the following claims.

What is claimed is:

1. An integrated circuit comprising:

a first T-coil formed in a first metal layer;

wherein the first T-coil comprises:

a first inductor connected to a first terminal and a second terminal;

a second inductor connected to the second terminal and a third terminal, wherein the first inductor comprises a first pattern in the first metal layer and the second inductor comprises a second pattern in the first metal layer, wherein the first pattern and the second pattern extend in parallel to each other in a first direction from the second terminal, and wherein the first pattern and the second pattern are configured to form a bridge capacitor of the first T-coil; and a second T-coil, wherein the second T-coil comprises;

a third inductor and a fourth inductor, wherein the third inductor is connected to a fourth terminal and a fifth terminal and the fourth inductor is connected to the fifth terminal and a sixth terminal, wherein the third inductor and the fourth inductor are formed in the first metal layer.

2. The integrated circuit of claim 1, wherein the first inductor and the second inductor are symmetrical to each other with respect to a line passing through the second terminal in the first direction.

3. The integrated circuit of claim 1, wherein a first signal applied to the first terminal and having a first frequency equal to or lower than a reference frequency passes through the first inductor and the second inductor, and wherein a second signal applied to the first terminal and having a second frequency higher than the reference frequency passes through the bridge capacitor.

4. The integrated circuit of claim 1, wherein the first metal layer is an uppermost metal layer among a plurality of metal layers of the integrated circuit.

5. The integrated circuit of claim 1, wherein the first pattern and the second pattern have widths smaller than a width of a pattern connected to a via of a lower layer than the first metal layer.

6. The integrated circuit of claim 1, further comprising: an electrostatic discharge (ESD) element connected to the second terminal.

7. The integrated circuit of claim 6, wherein an inductance of each of the first inductor and the second inductor is proportional to a capacitance of the ESD element, and wherein a capacitance of the bridge capacitor is proportional to the capacitance of the ESD element.

8. An integrated circuit comprising:

a first T-coil formed in a first metal layer;

wherein the first T-coil comprises:

a first inductor connected to a first terminal and a second terminal; and a second inductor connected to the second terminal and a third terminal, and wherein the first inductor comprises:

a first pattern in the first metal layer extending in a first direction from the second terminal;

a second pattern in the first metal layer, connected to the first pattern and extending in a second direction perpendicular to the first direction;

a third pattern in the first metal layer, connected to the second pattern and extending in a third direction opposite to the first direction; and a fourth pattern in the first metal layer, connected to the third pattern and the first terminal and extending in a fourth direction opposite to the second direction in the first metal layer; and a second T-coil, wherein the second T-coil comprises:

a third inductor and a fourth inductor, wherein the third inductor is connected to a fourth terminal and a fifth terminal, and the fourth inductor is connected to the fifth terminal and a sixth terminal, wherein the third inductor and the fourth inductor are formed in the first metal layer.

9. The integrated circuit of claim 8, wherein the first inductor and the second inductor are symmetrical to each other with respect to a line passing through the second terminal in the first direction.

10. The integrated circuit of claim 8, wherein each of the first pattern, the second pattern, the third pattern, and the fourth pattern have a same width.

11. The integrated circuit of claim 8, wherein the first metal layer is an uppermost metal layer among a plurality of metal layers of the integrated circuit.

12. The integrated circuit of claim 8, further comprising an electrostatic discharge (ESD) element connected to the second terminal, wherein each of the first inductor and the second inductor has a dimension determined based on a capacitance of the ESD element.

13. An integrated circuit comprising:

a first T-coil including a first inductor and a second inductor, wherein the first inductor is connected to a first terminal and a second terminal, and the second inductor is connected to the second terminal and a third terminal;

a first pad configured to electrically connect to the first terminal;

a first electrostatic discharge (ESD) element configured to electrically connect to the second terminal;

a first active circuit configured to electrically connect to the third terminal, wherein the first inductor and the second inductor are formed in a first metal layer; and a second T-coil, wherein the second T-coil comprises:

a third inductor and a fourth inductor wherein the third inductor is connected to a fourth terminal and a fifth terminal, and the fourth inductor is connected to the fifth terminal and a sixth terminal, wherein the third inductor and the fourth inductor are formed in the first metal layer.

14. The integrated circuit of claim 13, further comprising:

a second pad configured to electrically connect to the fourth terminal;

a second ESD element configured to electrically connect to the fifth terminal; and a second active circuit configured to electrically connect to the sixth terminal.

15. The integrated circuit of claim 14, further comprising:

a third pad provided between the first pad and the second pad; and a shield pattern configured to electrically connect to the third pad, formed on the first metal layer and extending between the first T-coil and the second T-coil.

16. The integrated circuit of claim 15, wherein the third pad is configured to be applied by a positive supply voltage or a negative supply voltage.

17. The integrated circuit of claim 15, further comprising a fourth pad, a fifth pad, and a sixth pad respectively facing the first pad, the second pad, and the third pad in a first direction;

wherein the first T-coil comprises a first pattern extending from the second terminal in a direction parallel to the first direction and away from the fourth pad, and wherein the second T-coil comprises a second pattern extending from the fifth terminal in a direction parallel to the first direction and away from the fifth pad.

18. The integrated circuit of claim 17, wherein the first inductor and the second inductor are symmetrical to each other with respect to a line passing through the second terminal in the first direction, wherein the third inductor and the fourth inductor are symmetrical to each other with respect to a line passing through the fifth terminal in the first direction.

19. The integrated circuit of claim 13, wherein the first metal layer is an uppermost metal layer among a plurality of metal layers under the first pad.

20. The integrated circuit of claim 13, wherein the integrated circuit is a memory device, and wherein the first pad is a data pin of the memory device.

* * * * *